US012261210B2

United States Patent
Siddik et al.

(10) Patent No.: US 12,261,210 B2
(45) Date of Patent: Mar. 25, 2025

(54) ELECTRONIC DEVICES COMPRISING DEUTERIUM-CONTAINING DIELECTRIC MATERIALS

(71) Applicant: Micron Technology, Inc., Boise, ID (US)

(72) Inventors: Manzar Siddik, Boise, ID (US); Terry H. Kim, Boise, ID (US); Kyubong Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/176,444

(22) Filed: Feb. 16, 2021

(65) Prior Publication Data
US 2022/0262919 A1 Aug. 18, 2022

(51) Int. Cl.
| | | |
|---|---|---|
| *H01L 29/51* | (2006.01) | |
| *H01L 21/28* | (2006.01) | |
| *H01L 29/423* | (2006.01) | |
| *H10B 43/27* | (2023.01) | |

(52) U.S. Cl.
CPC ...... *H01L 29/513* (2013.01); *H01L 29/40117* (2019.08); *H01L 29/4234* (2013.01); *H01L 29/517* (2013.01); *H01L 29/518* (2013.01); *H10B 43/27* (2023.02)

(58) Field of Classification Search
CPC ............. H01L 29/513; H01L 29/40117; H01L 21/76829
See application file for complete search history.

(56) References Cited

U.S. PATENT DOCUMENTS

| | | | |
|---|---|---|---|
| 5,972,765 A | 10/1999 | Clark et al. | |
| 6,949,433 B1 | 9/2005 | Hidehiko et al. | |
| 7,042,054 B1 | 5/2006 | Ramkumar et al. | |
| 9,018,693 B2 | 4/2015 | Ramkumar et al. | |
| 9,449,831 B2 * | 9/2016 | Levy | B82Y 10/00 |
| 10,153,262 B2 | 12/2018 | Isogai et al. | |
| 10,164,009 B1 * | 12/2018 | Carlson | H10B 41/30 |
| 2005/0255684 A1 | 11/2005 | Koldiaev et al. | |

(Continued)

FOREIGN PATENT DOCUMENTS

| | | |
|---|---|---|
| KR | 10-2006-0091414 A1 | 8/2006 |
| TW | 305025 B | 1/2009 |
| TW | 201830705 A | 8/2018 |

OTHER PUBLICATIONS

Micron White Paper, "Micron Transitions to Next-Generation 3D NAND Replacement-Gate Technology", https:/micron.com/NAND (2020) 6 pages.

(Continued)

*Primary Examiner* — Mohammad M Choudhry
(74) *Attorney, Agent, or Firm* — TraskBritt

(57) ABSTRACT

A method of forming an electronic device comprising forming an initial dielectric material comprising silicon-hydrogen bonds. A deuterium source gas and an oxygen source gas are reacted to produce deuterium species, and the initial dielectric material is exposed to the deuterium species. Deuterium of the deuterium species is incorporated into the initial dielectric material to form a deuterium-containing dielectric material. Additional methods are also disclosed, as are electronic devices and systems comprising the deuterium-containing dielectric material.

5 Claims, 7 Drawing Sheets

(56) References Cited

U.S. PATENT DOCUMENTS

| | | |
|---|---|---|
| 2006/0084242 A1 | 4/2006 | Wang |
| 2011/0045657 A1 | 2/2011 | Kim et al. |
| 2014/0051234 A1 | 2/2014 | Basim et al. |
| 2016/0118391 A1* | 4/2016 | Zhao .................... H01L 21/324 438/269 |
| 2020/0295035 A1 | 9/2020 | Sawa et al. |
| 2021/0280428 A1* | 9/2021 | Zhang ............... H01L 21/67103 |

OTHER PUBLICATIONS

Wu et al., Comprehensive Investigations on Charge Diffusion Physics in SiN-Based 3D NAND Flash Memory Through Systematical Ab initio Calculations, Conference Paper—Dec. 2017, https://researchgate.net/publication/322813547, 5 pages.

International Search Report for International Application No. PCT/US2022/015337, mailed Jun. 16, 2022, 4 pages.

International Written Opinion for International Application No. PCT/US2022/015337, mailed Jun. 16, 2022, 5 pages.

Taiwanese Search Report and Office Action from Taiwanese Application No. 111105643, dated Feb. 18, 2023, 15 pages with English translation.

* cited by examiner

ELECTRONIC DEVICES COMPRISING DEUTERIUM-CONTAINING DIELECTRIC MATERIALS

TECHNICAL FIELD

Embodiments disclosed herein relate to electronic devices and electronic device fabrication. More particularly, embodiments of the disclosure relate to electronic devices comprising deuterium treated films and to related methods and systems.

BACKGROUND

Flash memory devices have become one of the fastest growing segments of semiconductor memories because smartphones, hand-held gadgets and embedded applications all favor flash memory as a lightweight, fast, small and reliable alternative to disk storage. Memory device designers often desire to increase the level of integration or density of features (e.g., components) within a memory device by reducing the dimensions of the individual features and by reducing the separation distance between neighboring features. Memory device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) memory devices, such as 3D NAND devices, in which memory cells are stacked vertically on a substrate.

In some 3D NAND devices, the memory cells may include a charge storage structure (e.g., a so-called "charge trap" structure, which may also be known as a "storage node"). The charge trap structure may include a charge storage material (e.g., a dielectric material) operable to effectively "trap" and store an electrical charge during writing of the memory device. Erasing the memory device effectively removes the electrical charge from the charge trap structure. Charge storage materials utilized in 3D NAND devices require a high reliability due to the high electric field applied thereto and the high energy of the electrons transiting the electric field. When an electrical stress is applied, defects are created in the charge storage material, which includes silicon-hydrogen bonds.

DETAILED DESCRIPTION

Figure 1A:
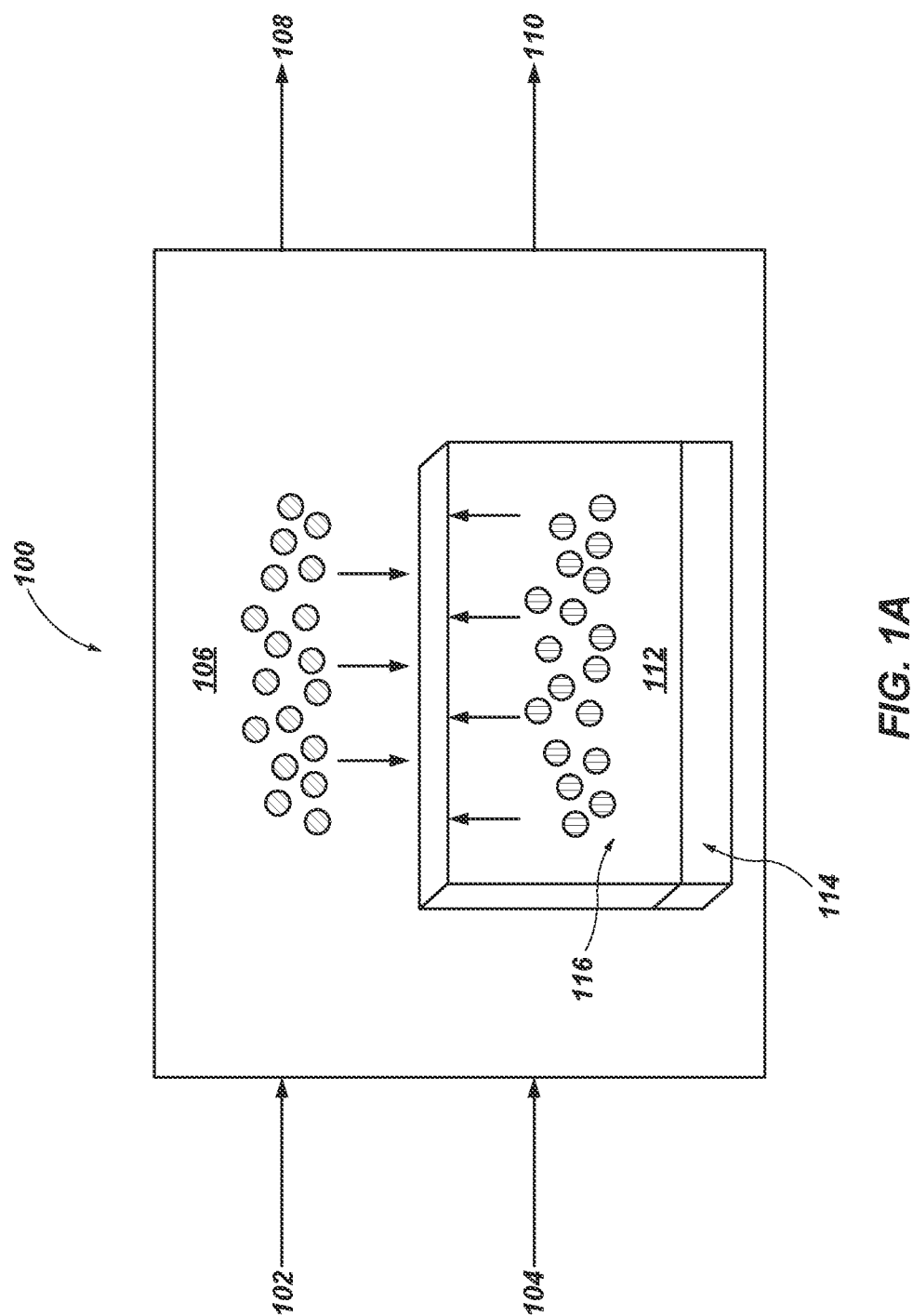
FIGS. 1A and 1B illustrate a method of forming an electronic device comprising a deuterium-containing dielectric material according to embodiments of the disclosure.

An electronic device (e.g., a semiconductor device, a memory device, a 3D NAND device) including a deuterium-containing dielectric material is disclosed. The deuterium-containing dielectric material is produced by forming an initial dielectric material on a substrate and replacing hydrogen in the initial dielectric material with deuterium by conducting a treatment act and a diffusion act. The deuterium-containing dielectric material may function as a charge trap and may be configured as a storage material, a tunnel barrier material, or other charge trap structure of the electronic device. The electronic device incorporating the deuterium-containing dielectric material may exhibit improved electrical performance compared to a conventional electronic device containing a hydrogen-containing dielectric material (e.g., the initial dielectric material).

The following description provides specific details, such as material types and processing conditions, in order to provide a thorough description of embodiments of the disclosed methods and electronic devices. However, a person of ordinary skill in the art will understand that the embodiments of the methods and electronic devices may be practiced without employing these specific details. Indeed, the embodiments of the methods and electronic devices may be practiced in conjunction with conventional semiconductor fabrication techniques employed in the industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide ($SiO_x$), such as silicon dioxide ($SiO_2$). The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

To form the deuterium-containing dielectric material, an initial dielectric material is formed and converted into the deuterium-containing dielectric material. The initial dielectric material may, for example, be formed on a substrate (e.g., a base material). The initial dielectric material may be formed by chemical vapor deposition (CVD), atomic layer deposition (ALD), or other conventional technique. The initial dielectric material may be formed utilizing a conventional CVD precursor or ALD precursor, where an appropriate precursor is selected depending on the dielectric material to be formed. The initial dielectric material may include, but is not limited to, silicon oxide ($SiO_x$), silicon nitride ($SiN_y$), silicon oxynitride ($SiO_xN_y$), silicon oxycarbide ($SiO_xC_y$), a high-k dielectric material or a combination thereof, where x and y are integers or non-integers. If the initial dielectric material (e.g., the as-formed dielectric material) is one of the silicon-containing materials, the precursors of the dielectric material do not include (e.g., lack) deuterium atoms. Instead, one or more of the precursors may include silicon atoms, nitrogen atoms, oxygen atoms, carbon atoms, hydrogen atoms, and/or halogen atoms. If the initial dielectric material (e.g., the as-formed dielectric material) is one of the silicon-containing materials, the initial dielectric material may include hydrogen atoms in addition to the silicon atoms, nitrogen atoms, carbon atoms, and/or oxygen atoms. If the initial dielectric material (e.g., the as-formed dielectric material) is the high-k dielectric material, the precursors of the high-k dielectric material do not include (e.g., lack) deuterium atoms. Instead, the precursors may include oxygen atoms, carbon atoms, hydrogen atoms, and/or halogen atoms in addition to atoms of the elements of the high-k dielectric material. If the initial dielectric material (e.g., the as-formed dielectric material) is the high-k dielectric material, the initial dielectric material may include hydrogen atoms in addition to the oxygen atoms, carbon atoms, and/or atoms of the elements of the high-k dielectric material.

If, for example, the initial dielectric material is silicon nitride, a nitrogen-containing precursor and a silicon precursor may be used to form the initial dielectric material. The nitrogen-containing precursor and/or the silicon precursor may also include hydrogen atoms or oxygen atoms. However, the precursors do not include (e.g., lack) deuterium atoms. By way of non-limiting example, the silicon nitride may be formed using ammonia ($NH_3$) as the nitrogen-containing precursor and dichlorosilane ($SiH_2Cl_2$) as the silicon-containing precursor. During the formation of the initial dielectric material, hydrogen atoms from one or more of the precursors may covalently bond to the silicon atoms, forming silicon dangling bonds (e.g., Si—H bonds) in the initial dielectric material. However, the presence of the hydrogen in the initial dielectric material is detrimental to the reliability and other performance properties of an electronic device containing the initial dielectric material. For example, the covalent bonds between the hydrogen atoms and the silicon atoms in the initial dielectric material are weak and may break during use and operation of the electronic device containing the initial dielectric material.

After formation of the initial dielectric material, a treatment act and a diffusion act are conducted in which the hydrogen in the initial dielectric material is replaced with deuterium, producing the deuterium-containing dielectric material. The treatment act may be conducted using a water vapor generator (WVG) system. An oxygen source gas and a deuterium source gas are introduced and reacted in the WVG system to produce deuterium species including, but not limited to, atomic deuterium ($D^+$), deuterium oxide ($D_2O$) and oxydeuterium ($OD^-$). Alternatively, a thermal system or a light system may be used to dissociate the deuterium source gas and initiate the reaction of the deuterium source gas with the oxygen source gas to form the deuterium species. The substrate on which the initial dielectric material is formed may be placed in a chamber operably coupled to the WVG system and the initial dielectric material is exposed to deuterium based treatment gases from the WVG system. Atomic deuterium is highly reactive and reacts with silicon atoms of the initial dielectric material, incorporating deuterium into the dielectric material, while the other deuterium species are removed as by-products. The atomic deuterium also reacts with the oxygen source gas to produce by-products, such as the deuterium oxide ($D_2O$) and oxydeuterium ($OD^-$). As the deuterium source gas enters the WVG system, the catalytic reaction occurs, resulting in disassociation of the deuterium source gas into deuterium species including the atomic deuterium.

The oxygen source gas and the deuterium source gas are supplied into the WVG system and undergo a catalytic chemical reaction to produce the deuterium species. The WVG system may contain a catalyst, such as catalyst-lined reactor or a catalyst cartridge, in which select gases are flowed into, for example, a catalyst-lined reactor located inside of the WVG system. The catalyst may include a metal or alloy, such as palladium, platinum, nickel, iron, chromium, ruthenium, rhodium, alloys thereof or combinations thereof. The WVG system may be a conventional system such as that commercially available from Fujikin of America, Inc., located in Santa Clara, California.

The oxygen source gas, for example, may be oxygen gas ($O_2$), and may be supplied to the WVG system in a pressurized gas cylinder, a pipeline supply system, or other conventional method of supplying gas to the WVG system. The deuterium source gas, for example, may be deuterium gas ($D_2$), and may be supplied to the WVG system in a pressurized gas cylinder, a pipeline supply system, or other conventional method of supplying gas to the WVG system. Both the oxygen source gas and the deuterium source gas may be commercially available. The source gases may be supplied to the WVG system simultaneously, or may be supplied to the WVG system at different times. For example, the oxygen gas may be introduced into the WVG system simultaneously along with the deuterium gas, or may be introduced before or after introducing the deuterium gas to the system.

The pressure utilized for the catalytic chemical reaction to occur may be atmospheric (e.g., 14.7 psi). Alternatively, the pressure may be less than atmospheric (e.g., low-pressure) or greater than atmospheric (e.g., high-pressure). The deuterium source gas and oxygen source gas may each be introduced (e.g., flowed) into the WVG system at a flow rate in the range from about 0.1 SLM (standard liter per minute) to about 20 SLM, preferably, from about 1 SLM to about 10 SLM. Regulating the flow of the oxygen and deuterium source gases enables precise control of oxygen and deuterium concentrations within the formed deuterium species.

The atomic deuterium ($D^+$) produced by the WVG system may become incorporated into the initial dielectric material by a diffusion act. Conditions within the chamber, such as temperature, and exposure time, may be selected to achieve the desired amount of deuterium incorporation into the dielectric material. The temperature within the chamber that contains the substrate on which the initial dielectric material is formed may be maintained within a range of from about 600° C. to about 800° C., such as from about 650° C. to about 700° C., from about 700° C. to about 750° C., or from about 750° C. to about 800° C. The diffusion act may be conducted for from about 1 minute to about 180 minutes, such as from about 10 minutes to about 90 minutes, from about 30 minutes to about 60 minutes, from about 30 minutes to about 90 minutes, or from about 120 minutes to about 180 minutes. By adjusting one or more of the temperature, pressure, flow rate, or exposure time, the amount of deuterium incorporated into the deuterium-containing dielectric material may be tailored.

The silicon-hydrogen (Si—H) bonds of the initial dielectric material are less stable than silicon-deuterium (Si-D)

bonds. Although deuterium and hydrogen have the same total energies and formation energies, Si-D bonds are more stable due to their vibrational state being 1.4 times larger than the vibrational state of Si—H bonds. As a result, the atomic deuterium ($D^+$) replaces the hydrogen atoms in the initial dielectric material during the treatment and diffusion acts, forming deuterium covalently bonded to silicon (e.g., the Si-D bonds). The atomic deuterium may replace substantially all of the hydrogen in the initial dielectric material, producing the deuterium-containing dielectric material. By way of example only, the deuterium may replace greater than or equal to about 90% of the hydrogen in the initial dielectric material, such as greater than or equal to about 95% of the hydrogen. The deuterium may be dispersed throughout the deuterium-containing dielectric material, such as homogeneously dispersed throughout the deuterium-containing dielectric material. The deuterium may penetrate into the initial dielectric material a depth of from about 1 nm to about 10 nm. By using precursors that lack deuterium atoms to form the initial dielectric material and by conducting the treatment and diffusion acts after forming the initial dielectric material, the deuterium-containing dielectric material may be formed where substantially all of the hydrogen in the initial dielectric material is replaced with the deuterium. The presence of the Si-D bonds in place of the Si—H bonds may reduce defects in the dielectric material. Without being bound by any theory, the reduction in the defects may result in a higher reliability of the electronic device, such as a 3D NAND device, containing the deuterium-containing dielectric material.

If the initial dielectric material is a high-k dielectric material, an initial high-k dielectric material may be converted to the deuterium-containing dielectric material in substantially the same way as described above for the silicon-containing initial dielectric material. After generating the deuterium species, the atomic deuterium may react with atoms of the high-k dielectric material, replacing substantially all of the hydrogen in the initial high-k dielectric material and producing the deuterium-containing dielectric material.

Figure 1B:
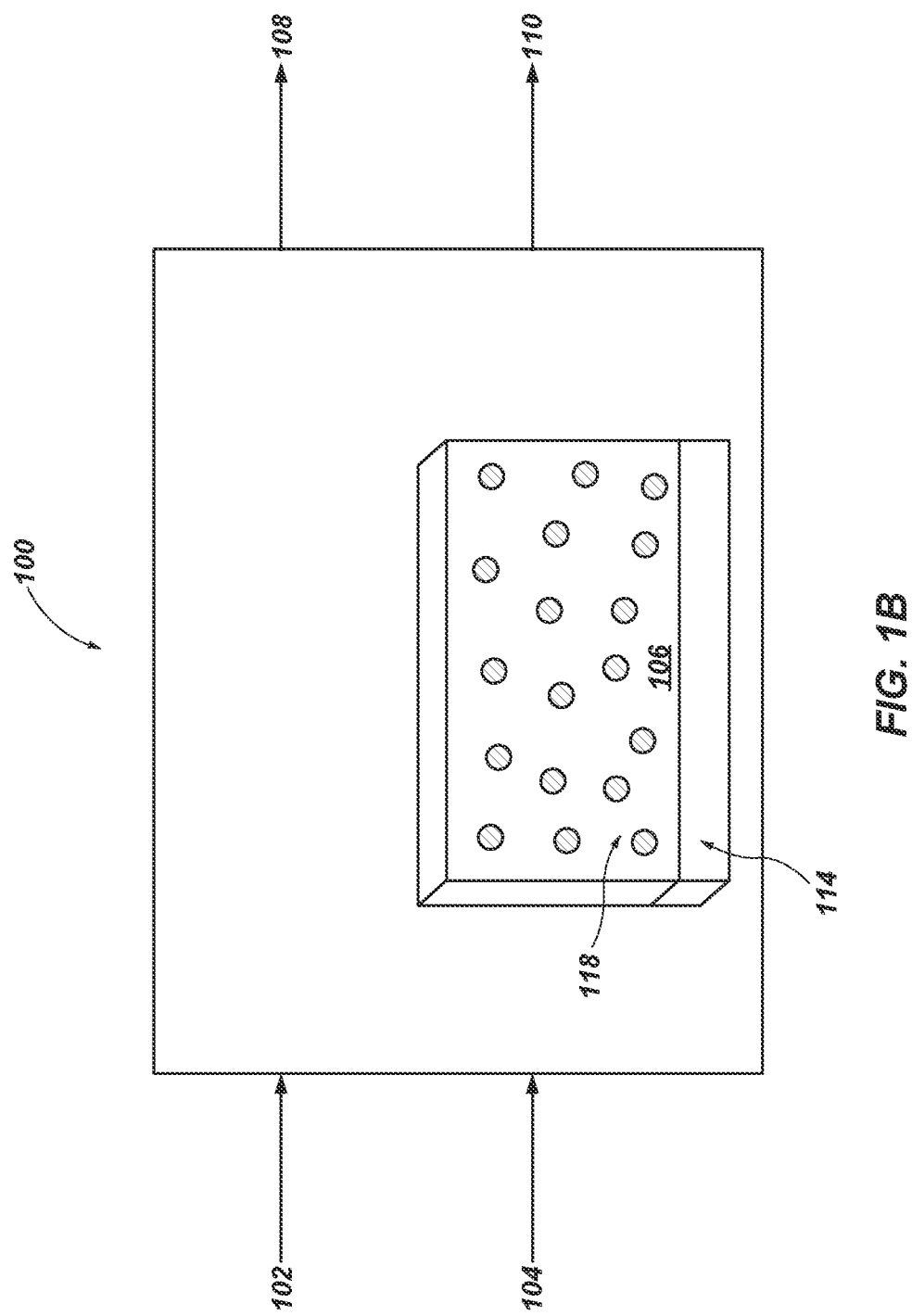

FIGS. 1A and 1B illustrate a method of producing a deuterium-containing dielectric material 118 using a catalytic reaction generating system (e.g., a WVG system) (not shown) for generating the deuterium species. However, the deuterium species may be generated by other systems, such as by generating the deuterium species using heat (a thermal process) or light. As shown in FIG. 1A, a substrate 114 having an initial dielectric material 116 formed thereon may be placed in a chamber 100. An oxygen source gas 102 and a deuterium source gas 104 may be reacted in the catalytic reaction generating system (not shown) to produce the deuterium species, including atomic deuterium 106 and the by-products deuterium oxide 108 and oxydeuterium 110. The deuterium species may then be introduced into the chamber 100. The atomic deuterium 106 diffuses into the initial dielectric material 116 and replaces hydrogen atoms 112 with deuterium atoms, as shown in FIG. 1B. After substantially all of the hydrogen atoms 112 are replaced with the deuterium, the deuterium-containing dielectric material 118 substantially free of hydrogen is formed.

By way of non-limiting example, the initial dielectric material may be formed on a substrate in one chamber and moved to another chamber for the treatment and diffusion acts to produce the deuterium-containing dielectric material. In another example, the initial dielectric material may be formed on a substrate in the same chamber as the treatment and diffusion acts are conducted to produce the deuterium-containing dielectric material.

Figure 2A:
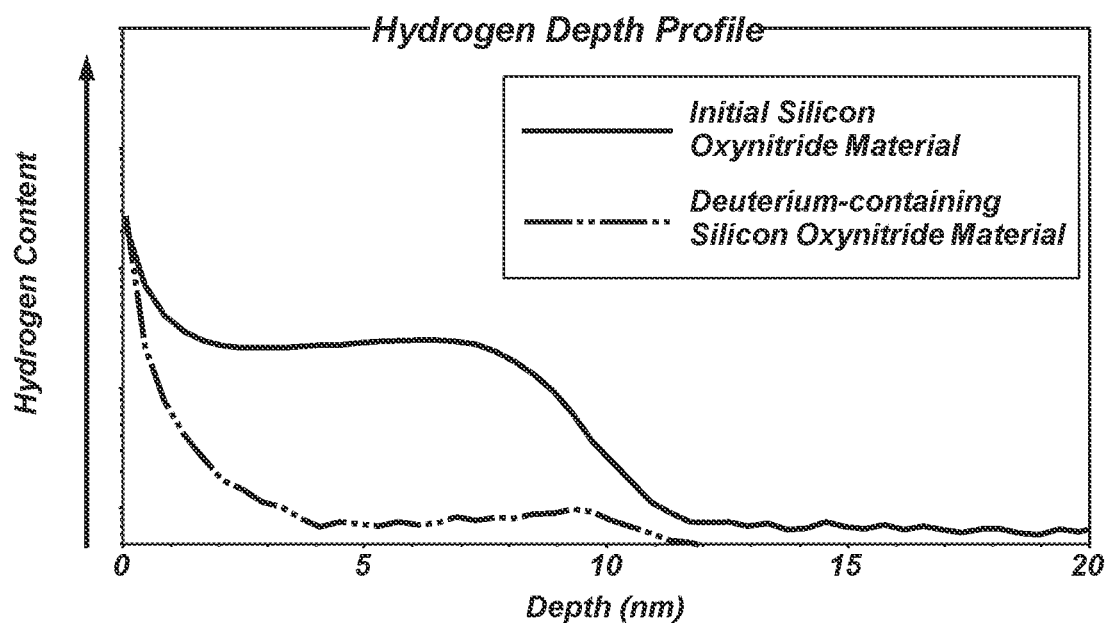
FIGS. 2A and 2B are graphs showing hydrogen and deuterium content as a function of depth in deuterium-containing dielectric materials according to embodiments of the disclosure.
Figure 2B:
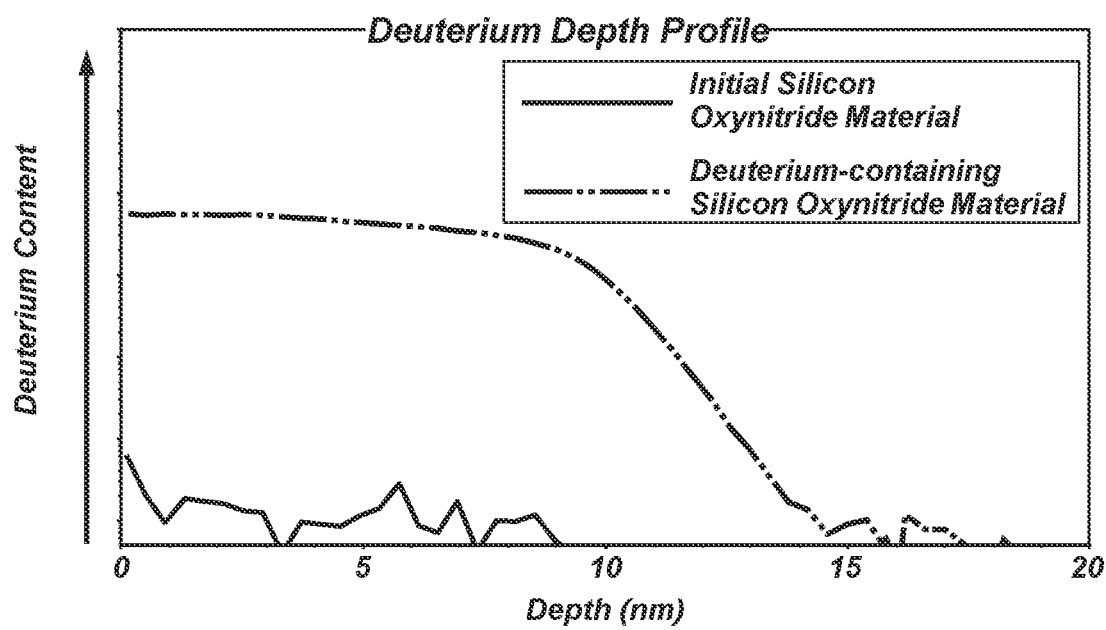

During the treatment act and diffusion act, deuterium is incorporated into the initial dielectric material 116 as graphically shown in FIGS. 2A and 2B. FIG. 2A illustrates the relative hydrogen content in, for example, a silicon oxynitride material as a function of depth measured from the surface of the material. The relative hydrogen content in the silicon oxynitride material before (e.g., an initial silicon oxynitride material) and after (e.g., a deuterium-containing silicon oxynitride material) conducting the treatment and diffusion acts is shown in FIGS. 2A and 2B. In other words, the deuterium-containing silicon oxynitride material is the initial silicon oxynitride material that has been subjected to the treatment and diffusion acts according to embodiments of the disclosure. The hydrogen content of the initial dielectric material is measured by conventional techniques at various depths. As shown in FIG. 2A, the treatment and diffusion acts replaced hydrogen of the silicon oxynitride material with deuterium, forming the deuterium-containing silicon oxynitride material. The hydrogen content in the deuterium-containing silicon oxynitride material is substantially lower than the hydrogen content in the initial silicon oxynitride material for a particular depth.

FIG. 2B illustrates the relative deuterium content as a function of depth measured from the surface of the initial silicon oxynitride material and the deuterium-containing silicon oxynitride material. As shown in FIG. 2B, the deuterium content in the deuterium-containing silicon oxynitride material is substantially higher than the deuterium content in the initial silicon oxynitride material for a particular depth. Therefore, the treatment act and diffusion act reduced the amount of hydrogen and increased the amount of deuterium in the silicon oxynitride material, forming the deuterium-containing silicon oxynitride material.

Accordingly, a method of forming an electronic device is disclosed. The method comprises forming an initial dielectric material comprising silicon-hydrogen bonds. A deuterium source gas and an oxygen source gas are reacted to produce deuterium species, and the initial dielectric material is exposed to the deuterium species. Deuterium of the deuterium species is incorporated into the initial dielectric material to form a deuterium-containing dielectric material.

Accordingly, another method of forming an electronic device is disclosed. The method comprises forming an initial dielectric material comprising a silicon-containing dielectric material or a high-k dielectric material, the initial dielectric material further comprising hydrogen. A treatment act is performed on the initial dielectric material and comprises producing deuterium species from an oxygen source gas and a deuterium source gas. Deuterium is diffused from the deuterium species into the initial dielectric material to replace hydrogen in the initial dielectric material and to form a deuterium-containing dielectric material.

Figure 3:
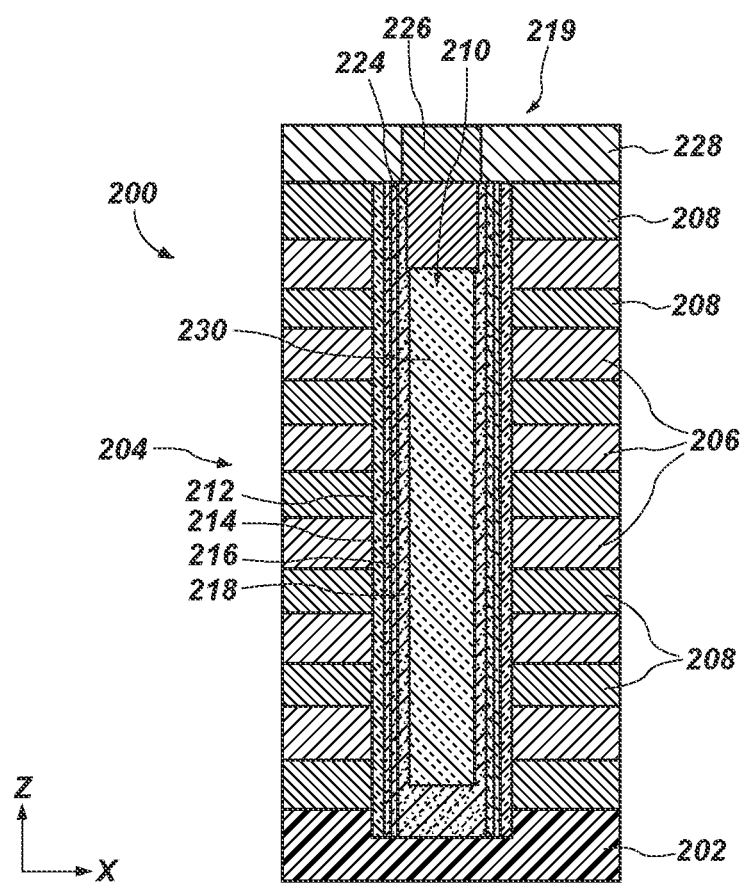
FIG. 3 is a cross-sectional view of an electronic device including one or more deuterium-containing dielectric materials according to embodiments of the disclosure.

The deuterium-containing dielectric material of embodiments of the disclosure may be used in an electronic device to trap charge. FIG. 3 shows an electronic device 200 that includes one or more deuterium-containing dielectric materials according to embodiments of the disclosure. The electronic device 200 includes a stack 204 of alternating tiers of conductive materials 206 (e.g., conductive gate materials) and dielectric materials 208 overlying a base material 202 (e.g., a substrate, a conductive line, such as a source line). For simplicity, additional components of the electronic device 200 located below the base material 202 are not shown. A pillar 219 (e.g., a memory pillar) is located with an opening 210 extending vertically through the stack 204. The pillar 219 includes an oxide material 212, a storage node 214, a tunnel region 216, a channel material 218, and a fill material 230. The oxide material 212 (e.g., a block oxide material) of the pillar 219 is laterally adjacent to the stack 204 within the opening 210. The storage node 214 (e.g., a nitride material) is laterally adjacent (e.g., inwardly laterally adjacent) to the oxide material 212 and the tunnel region 216 (e.g., an inner oxide material) is laterally adjacent (e.g., inwardly laterally adjacent) to the storage node 214. Each of the oxide material 212, the storage node 214, and the tunnel region 216 are continuous (e.g., extend continuously) in the vertical direction (Z-direction) of the opening 210. The deuterium-containing dielectric material according to embodiments of the disclosure may be used as one or more of the oxide material 212, the storage node 214, or the tunnel region 216 of the electronic device 200 and is formed as described above.

The channel material 218 is laterally adjacent (e.g., inwardly laterally adjacent) to the tunnel region 216 and adjacent to (e.g., on or over) the base material 202. The fill material 230 extends between inner sidewalls of the channel material 218. The fill material 230 is located in a central portion of the pillar 219 and may function as a structural support within the electronic device 200. A plug material 224 (e.g., a drain contact plug material) is adjacent to (e.g., on or over) each of the channel material 218 and the fill material 230 and is laterally adjacent (e.g., inwardly laterally adjacent) to the channel material 218. A data line 226 (e.g., bit line, digit line) is adjacent to (e.g., on or over) the plug material 224 and laterally adjacent to (e.g., substantially surrounded by) a cap material 228 adjacent to (e.g., on or over) upper surfaces of the stack 204. For simplicity, additional components of the electronic device 200 located above the data line 226 are not shown. The components of the electronic device 200 shown in FIG. 3 may be formed by conventional techniques.

If the deuterium-containing dielectric material is configured as the oxide material 212, the oxide material 212 may be formed laterally adjacent to the stack 204 and within the opening 210. As described above, an as-formed (e.g., initial) oxide material may include hydrogen and is formed by conventional techniques. Deuterium is incorporated into the initial oxide material as described above, producing the oxide material 212, which includes deuterium (e.g., Si-D bonds) in place of the hydrogen. The initial oxide material may be formed of and include, but is not limited to, silicon dioxide, aluminum oxide, gadolinium oxide, hafnium oxide, niobium oxide, tantalum oxide, titanium oxide, zirconium oxide, or a combination thereof. The oxide material 212 may, include, but is not limited to, deuterium-containing silicon dioxide, deuterium-containing aluminum oxide, deuterium-containing hafnium oxide, deuterium-containing zirconium oxide, deuterium-containing gadolinium oxide, deuterium-containing niobium oxide, deuterium-containing tantalum oxide, deuterium-containing titanium oxide or a combination thereof. The oxide material 212 may, for example, be configured as a charge-blocking material that is conformally formed on the inner sidewalls of the stack 204 of alternating tiers of conductive materials 206 and dielectric materials 208 overlying the base material 202.

If the deuterium-containing dielectric material is configured as the storage node 214 (e.g., a nitride storage material, a charge storage material), the storage node 214 may be formed (e.g., conformally formed) laterally adjacent to the oxide material 212 (e.g., conformally formed) laterally adjacent to the storage node 214. As described above, an as-formed (e.g., initial) storage node material may include hydrogen and is formed by conventional techniques. The initial storage node material may include, but is not limited to, silicon nitride, silicon oxynitride, or a combination thereof. Deuterium is then incorporated into the initial storage node material as described above, producing the storage node 214, which includes deuterium (e.g., Si-D bonds). The storage node 214 may include deuterium-containing silicon nitride, deuterium-containing silicon oxynitride, or a combination thereof. A portion of the storage node 214 may function as a charge trap region during use and operation of the electronic device 200.

If the deuterium-containing dielectric material is configured as the tunnel region 216, the tunnel region 216 may be formed (e.g., conformally formed) laterally adjacent to the storage node 214. The as-formed (e.g., initial) tunnel region material includes hydrogen and is formed by conventional techniques. The as-filed tunnel region material may include, but is not limited to, silicon dioxide, aluminum oxide, hafnium oxide, zirconium oxide, silicon oxynitride, silicon nitride or a combination thereof. Deuterium is then incorporated into the initial tunnel region material as described above, producing the tunnel region 216, which includes deuterium (e.g., Si-D bonds). The tunnel region 216 may form a barrier between the storage node 214 and the channel material 218. In some embodiments, the tunnel region 216 may be formed as a so-called "oxide-nitride-oxide" (ONO) structure (e.g., an interlayer poly dielectric structure), which may be referred to in the art as a barrier engineered material. The tunnel region 216 may include, but is not limited to, deuterium-containing silicon dioxide, deuterium-containing aluminum oxide, deuterium-containing hafnium oxide, deuterium-containing zirconium oxide, deuterium-containing silicon oxynitride, deuterium-containing silicon nitride or a combination thereof.

While the deuterium-containing dielectric material is described above as being configured as one or more of the oxide material 212, the storage node 214, or the tunnel region 216 of the electronic device 200, the deuterium-containing dielectric material may be used in other portions of the electronic device 200 where charge trap properties are desired. The deuterium-containing dielectric material may also be used in other electronic devices where charge trap properties are desired. The deuterium-containing dielectric material provides reduced charge traps, improving time zero and retention properties of the electronic device 200, without substantially affecting electrical performance of the electronic device 200.

The electronic devices and systems according to embodiments of the disclosure advantageously facilitate one or more of improved reliability, charge retention and memory window compared to conventional electronic devices that utilize hydrogen-containing dielectric materials for charge trap materials. The electronic devices containing the deuterium-containing dielectric material exhibit improved time zero and through cycling charge retention properties compared to the conventional electronic devices. The methods of forming the electronic devices according to embodiments of the disclosure facilitate the formation of electronic devices (e.g., apparatuses, microelectronic devices, electronic devices) and systems (e.g., electronic systems) having one or more of improved performance, reliability, and durability, increased memory window, and improved charge retention as compared to conventional devices including the hydrogen-containing dielectric materials.

Accordingly, an electronic device is disclosed. The electronic device comprises a stack of alternating dielectric materials and conductive materials. A pillar region extends vertically through the stack of alternating dielectric materials and conductive materials. A deuterium-containing dielectric material that is substantially free of hydrogen is within the pillar region and laterally adjacent to the dielectric materials and the conductive materials of the stack.

Figure 4:
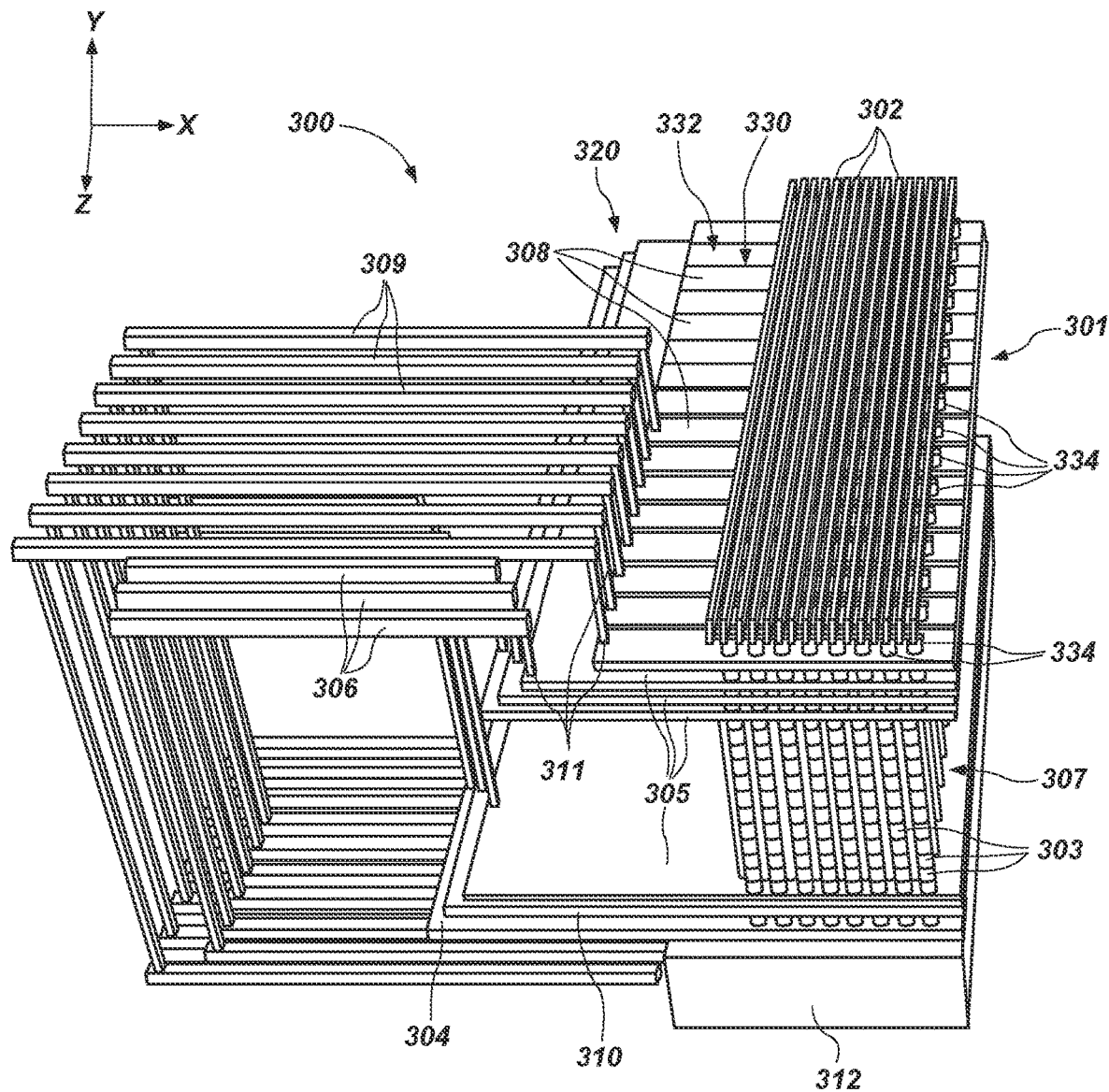
FIG. 4 is a partial cutaway perspective view of an electronic device, in accordance with embodiments of the disclosure.

FIG. 4 illustrates a partial cutaway perspective view of a portion of an electronic device 300 (e.g., a microelectronic device, a memory device, such as a 3D NAND Flash memory device) including an electronic structure 301 (e.g., a microelectronic device structure), which is substantially similar to the electronic device 200 described with reference to FIG. 3. As shown in FIG. 4, the electronic structure 301 of the electronic device 300 may include a staircase structure 320 defining contact regions for connecting access lines 306 to conductive structures 305 (e.g., corresponding to the conductive materials 206 (FIG. 3)). The electronic structure 301 may include vertical strings 307 of memory cells 303 that are coupled to each other in series. The vertical strings 307 may extend vertically (e.g., in the Z-direction) and orthogonally to conductive lines and the conductive structures 305, such as data lines 302 (e.g., the data line 226 (FIG. 3)), a source tier 304, the access lines 306, first select gates 308 (e.g., upper select gates, drain select gates (SGDs)) corresponding to the upper conductive materials 206 (FIG. 3), select lines 309, and a second select gate 310 (e.g., a lower select gate, a source select gate (SGS)) corresponding to the lower conductive materials 206 (FIG. 3). The first select gates 308 may be horizontally divided (e.g., in the Y-direction) into multiple blocks 332 horizontally separated (e.g., in the Y-direction) from one another by slots 330.

Vertical conductive contacts 311 may electrically couple components to each other as shown. For example, the select lines 309 may be electrically coupled to the first select gates 308 and the access lines 306 may be electrically coupled to the conductive structures 305. The electronic device 300 may also include a control unit 312 positioned under the memory array, which may include at least one of string driver circuitry, pass gates, circuitry for selecting gates, circuitry for selecting conductive lines (e.g., the data lines 302, the access lines 306), circuitry for amplifying signals, and circuitry for sensing signals. The control unit 312 may be electrically coupled to the data lines 302, the source tier 304, the access lines 306, the first select gates 308, and the second select gates 310, for example. In some embodiments, the control unit 312 includes CMOS (complementary metal-oxide-semiconductor) circuitry. In such embodiments, the control unit 312 may be characterized as having a "CMOS under Array" ("CuA") configuration.

The first select gates 308 may extend horizontally in a first direction (e.g., the X-direction) and may be coupled to respective first groups of vertical strings 307 of memory cells 303 at a first end (e.g., an upper end) of the vertical strings 307. The second select gate 310 may be formed in a substantially planar configuration and may be coupled to the vertical strings 307 at a second, opposite end (e.g., a lower end) of the vertical strings 307 of memory cells 303.

The data lines 302 (e.g., digit lines, bit lines) may extend horizontally in a second direction (e.g., in the Y-direction) that is at an angle (e.g., perpendicular) to the first direction in which the first select gates 308 extend. Individual data lines 302 may be coupled to individual groups of the vertical strings 307 extending the second direction (e.g., the Y-direction) at the first end (e.g., the upper end) of the vertical strings 307 of the individual groups. Additional individual group of the vertical strings 307 extending the first direction (e.g., the X-direction) and coupled to individual first select gates 308 may share a particular vertical string 307 thereof with individual group of vertical strings 307 coupled to an individual data line 302. Thus, an individual vertical string 307 of memory cells 303 may be selected at an intersection of an individual first select gate 308 and an individual data line 302. Accordingly, the first select gates 308 may be used for selecting memory cells 303 of the vertical strings 307 of memory cells 303.

The conductive structures 305 (e.g., word lines) (corresponding to the conductive materials 206) may extend in respective horizontal planes. The conductive structures 305 may be stacked vertically, such that each conductive structure 305 is coupled to at least some of the vertical strings 307 of memory cells 303, and the vertical strings 307 of the memory cells 303 extend vertically through the stack structure including the conductive structures 305. The conductive structures 305 may be coupled to or may form control gates of the memory cells 303.

The first select gates 308 and the second select gates 310 may operate to select a vertical string 307 of the memory cells 303 interposed between data lines 302 and the source tier 304. Thus, an individual memory cell 303 may be selected and electrically coupled to a data line 302 by operation of (e.g., by selecting) the appropriate first select gate 308, second select gate 310, and conductive structure 305 that are coupled to the particular memory cell 303.

The staircase structure 320 may be configured to provide electrical connection between the access lines 306 and the conductive structures 305 through the vertical conductive contacts 311. In other words, an individual conductive structure 305 may be selected via an access line 306 in electrical communication with a respective vertical conductive contact 311 in electrical communication with the conductive structure 305. The data lines 302 may be electrically coupled to the vertical strings 307 through conductive contact structures 334.

Figure 5:
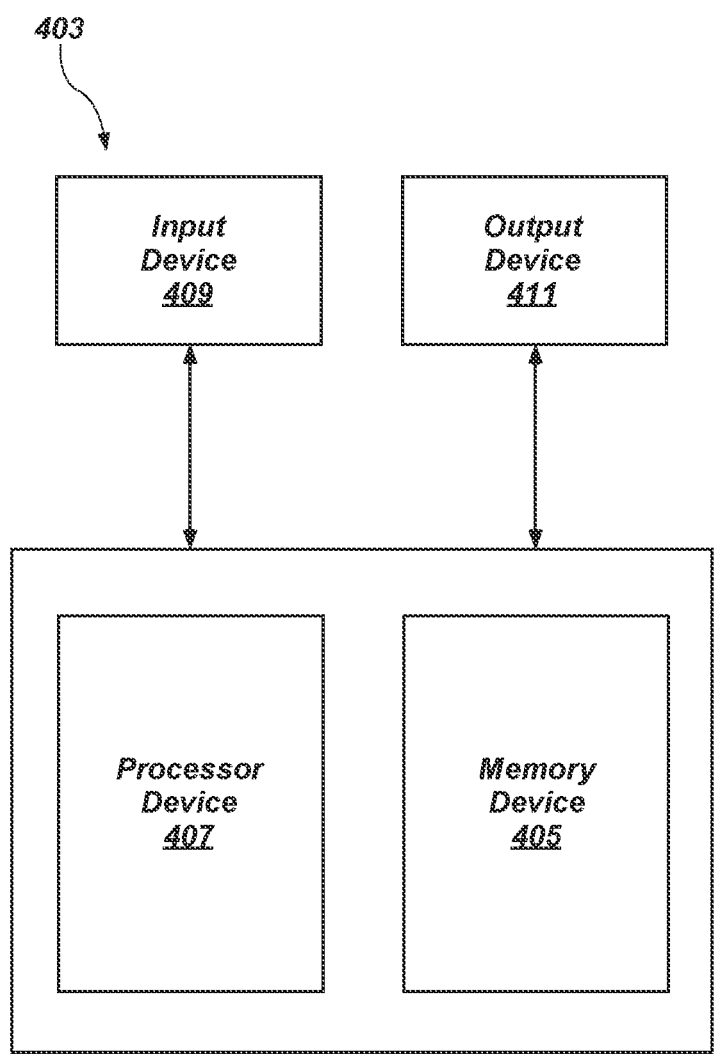
FIG. 5 is a schematic block diagram illustrating an electronic system, in accordance with embodiments of the disclosure.

Electronic devices (e.g., the electronic devices 200, 300) including the deuterium-containing dielectric material, according to embodiments of the disclosure may be used in embodiments of electronic systems of the disclosure. For example, FIG. 5 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of an electronic device (e.g., the electronic devices 200, 300) previously described herein with reference to FIG. 3 and FIG. 4 including the deuterium-containing dielectric material.

The electronic system 403 may further include at least one electronic signal processor device 407 (often referred to as a "microprocessor"). The electronic signal processor device 407 may, optionally, include an embodiment of an electronic device (e.g., one or more of the electronic devices 200, 300) previously described herein with reference to FIG. 3 and FIG. 4. The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 6:
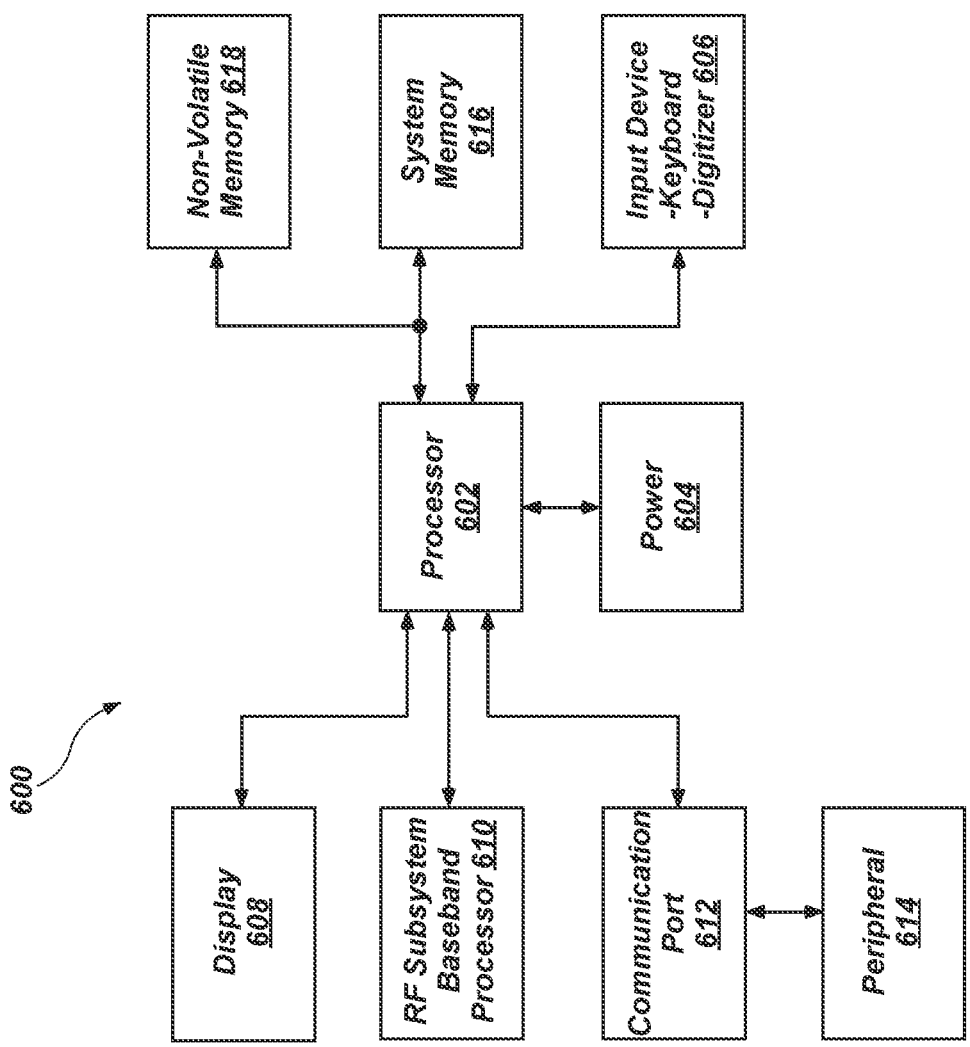
FIG. 6 is a schematic block diagram of a processor-based system, in accordance with embodiments of the disclosure.

With reference to FIG. 6, depicted is a processor-based system 600. The processor-based system 600 may include various electronic devices (e.g., one or more of the electronic devices 200, 300) manufactured in accordance with embodiments of the disclosure. The processor-based system 600 may be any of a variety of types such as a computer, pager, cellular phone, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include electronic devices (e.g., one or more of the electronic devices 200, 300) manufactured in accordance with embodiments of the disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may be coupled to the processor 602. The user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not shown). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 616 may include volatile memory, non-volatile memory, or a combination thereof. The system memory 616 is typically large so that it can store dynamically loaded applications and data. In some embodiments, the system memory 616 may include semiconductor devices, such as the electronic devices (e.g., the electronic devices 200, 300) described above, or a combination thereof.

The processor 602 may also be coupled to non-volatile memory 618, which is not to suggest that system memory 616 is necessarily volatile. The non-volatile memory 618 may include one or more of STT-MRAM, MRAM, read-only memory (ROM) such as an EPROM, resistive read-only memory (RROM), and flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory such as disk drive memory, such as a hybrid-drive including resistive memory or other types of non-volatile solid-state memory, for example. The non-volatile memory 618 may include electronic devices, such as the electronic devices (e.g., the electronic devices 200, 300) described above, or a combination thereof.

Accordingly, a system comprising a processor operably coupled to an input device and an output device, and a memory device operably coupled to the processor and comprising at least one electronic device is disclosed. The at least one electronic device comprises strings of memory cells vertically extending through a stack of alternating dielectric materials and conductive materials, and a channel region within a pillar region of the at least one electronic device. The at least one electronic device comprises a deuterium-containing, substantially hydrogen-free dielectric material within the pillar region and laterally adjacent to the dielectric materials and the conductive materials of the stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:
1. An electronic device comprising:
   a stack of alternating dielectric materials and conductive materials;
   a pillar region extending vertically through the stack;
   a tunnel region adjacent to a channel region within the pillar region, a storage node adjacent to the tunnel region and extending continuously along a vertical direction of the pillar region, and an oxide material adjacent to the storage node and directly adjacent to the stack; and a deuterium-containing dielectric material substantially free of hydrogen within the pillar region and laterally adjacent to the dielectric materials and the conductive materials of the stack, the deuterium-containing, substantially hydrogen-free dielectric material being limited to one or more of the oxide material, the storage node and the tunnel region.

2. An electronic device comprising:

a stack of alternating dielectric materials and conductive materials;

a pillar region extending vertically through the stack; and a deuterium-containing dielectric material substantially free of hydrogen within the pillar region and laterally adjacent to the dielectric materials and the conductive materials of the stack, the deuterium-containing dielectric material comprising aluminum oxide, gadolinium oxide, niobium oxide, tantalum oxide, titanium oxide, or hafnium silicate, deuterium of the deuterium-containing dielectric material extending a depth of from about 1 nm to about 10 nm within the pillar region.

3. The electronic device of claim 1, wherein the deuterium-containing dielectric material comprises greater than about 90% deuterium and less than about 10% hydrogen.

4. The electronic device of claim 1, wherein the deuterium-containing dielectric material is configured as the oxide material, the storage node, or the tunnel region of the electronic device.

5. An electronic device, comprising:

strings of memory cells vertically extending through a stack of alternating dielectric materials and conductive materials;

a channel region within a pillar region of the electronic device;

a tunnel region adjacent to the channel region within the pillar region, and a storage node region adjacent to the tunnel region and extending continuously along a vertical direction of the pillar region; and a deuterium-containing, substantially hydrogen-free dielectric material within the pillar region and laterally adjacent to the dielectric materials and the conductive materials of the stack, the deuterium-containing, substantially hydrogen-free dielectric material being limited to one or more of an oxide material, the storage node region and the tunnel region, and the deuterium-containing, substantially hydrogen-free dielectric material comprising deuterium atoms covalently bonded to silicon atoms.

* * * * *